US00RE44179E

(19) United States
(12) Reissued Patent
Abe et al.

(10) Patent Number: US RE44,179 E
(45) Date of Reissued Patent: Apr. 30, 2013

(54) CHARGED PARTICLE BEAM WRITING METHOD

(75) Inventors: Takayuki Abe, Kanagawa (JP); Tetsuo Yamaguchi, Kanagawa (JP); Fumio Hide, Kanagawa (JP)

(73) Assignee: Nuflare Technology, Inc., Numazu-shi (JP)

(21) Appl. No.: 13/553,354

(22) Filed: Jul. 19, 2012

Related U.S. Patent Documents

Reissue of:
(64) Patent No.: 7,759,659
Issued: Jul. 20, 2010
Appl. No.: 12/193,146
Filed: Aug. 18, 2008

(30) Foreign Application Priority Data

Aug. 29, 2007 (JP) ..... 2007-222646

(51) Int. Cl.
*G21K 1/00* (2006.01)
*G21K 5/10* (2006.01)
*H01J 37/21* (2006.01)

(52) U.S. Cl.
USPC ..... 250/492.22; 250/492.23; 250/492.3; 250/396 R; 250/398

(58) Field of Classification Search ..... 250/492.22, 250/492.23, 492.3, 396 R, 398
See application file for complete search history.

(56) References Cited

U.S. PATENT DOCUMENTS

| | | | | |
|---|---|---|---|---|
| 6,815,698 | B2 * | 11/2004 | Nagano et al. | 250/492.22 |
| 7,601,968 | B2 * | 10/2009 | Abe et al. | 250/396 R |
| 7,705,321 | B2 * | 4/2010 | Abe | 250/396 R |
| 7,928,414 | B2 * | 4/2011 | Abe | 250/492.23 |
| 2008/0296515 | A1 * | 12/2008 | Abe | 250/492.3 |

FOREIGN PATENT DOCUMENTS

| | | |
|---|---|---|
| JP | 53-145477 | 12/1978 |
| JP | 2006-128564 | 5/2006 |

OTHER PUBLICATIONS

Office Action issued Jan. 17, 2012 in Japanese Patent Appl. No. 2007-222646 (with an English translation).

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A writing method includes emitting a first charged particle beam formed to be a first shape by passing through a first shaping aperture and a second shaping aperture, onto a target workpiece; and emitting a second charged particle beam formed to be a second shape by passing through the first shaping aperture and the second shaping aperture, wherein the second charged particle beam is superimposed onto a same position exposed by the first charged particle beam and is formed by using an opposite sides of respective first and second shaping apertures to those used for the first shape.

5 Claims, 12 Drawing Sheets

10
D'
A'
22
C'
B'
12
Reference Position
12
D
A
20
C
B
10

B'
C'
B
C
45
42
44
43
A'
D'
A
D

Profile Obtained
46
47
48
CD
Th

Related Art

CHARGED PARTICLE BEAM WRITING METHOD

Matter enclosed in heavy brackets [ ] appears in the original patent but forms no part of this reissue specification; matter printed in italics indicates the additions made by reissue.

CROSS-REFERENCE TO RELATED APPLICATION

This application is based upon and claims the benefit of priority from the prior Japanese Patent Application No. 2007-222646 filed on Aug. 29, 2007 in Japan, the entire contents of which are incorporated herein by reference.

BACKGROUND OF THE INVENTION

1. Field of the Invention

This invention relates to a pattern writing method with charged particle beam, and for example, to a writing method of a writing apparatus which varies a beam shape by letting the beam pass through two shaping apertures.

2. Description of Related Art

The lithography technique that drives advancement of micro-scaling of semiconductor devices is extremely important being the only process to form patterns in semiconductor manufacturing processes. In recent years, with high integration of large-scale integrated circuits (LSI), critical dimensions required for semiconductor device circuits are shrinking year by year. In order to form a desired circuit pattern on semiconductor devices, a master pattern (called a mask or a reticle) of high precision is required. The electron beam intrinsically has excellent resolution and is used for generating such highly precise master patterns.

FIG. 13 is a schematic diagram to illustrate operations of a variable-shaped electron beam (EB) type pattern writing apparatus. As shown in the figure, the variable-shaped electron beam writing apparatus, including two aperture plates, operates as follows: A first shaping aperture plate 410 has a rectangular opening or "hole" 411 for shaping an electron beam 330. This shape of the rectangular opening may also be a square, a rhombus, a rhomboid, etc. A second shaping aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through the variable-shaped opening 421 and thereby to irradiate a target workpiece or "sample" mounted on a stage which is continuously moved in one predetermined direction (e.g. X direction) during the writing or "drawing." In other words, a rectangular shape formed as a result of passing through both the opening 411 and the variable-shaped opening 421 is written or "drawn" in the writing region of a target workpiece 340 on the stage. This method of forming a given shape by letting beams pass through both the opening 411 and the variable-shaped opening 421 is called a "variable shaped" method.

As mentioned above, each side of a formed rectangle is shaped by either of the opening 411 or the variable-shaped opening 421. In the variable-shaped type electron beam pattern writing apparatus, beam resolution degradation is induced by space charge effect. The space charge effect is proportional to multiplication result of (or product of multiplying) current density, shot area, and beam travel distance.

Concretely, the space charge effect is incurred as follows: In FIG. 13, assuming the current density is constant and common over the area in question, the area of the opening 411 is denoted $S_0$, the area of the beam which passes through the variable-shaped opening 421 after passing through the opening 411 is denoted $S_2$, the distance from the opening 411 to the variable-shaped opening 421 is denoted $L_1$, and the distance from the variable-shaped opening 421 to the target workpiece 340 is denoted $L_2$. In that case, the space charge effect on the side of the beam shaped by the opening 411 is proportional to $L_1 \times S_0 + L_2 \times S_2$. On the other hand, the space charge effect on the side of the beam shaped by the variable-shaped opening 421 is proportional to $L_2 \times S_2$. Since the space charge effect on the side of the beam shaped by the opening 411 is larger, resolution thereon deteriorates more than the other side.

FIG. 14 shows an example of beam profile of a beam formed by the first and second shaping apertures. It is known from FIG. 15 that the resolution deteriorates more along the side formed by the first shaping aperture (opening 411) than the other side formed by the second shaping aperture (variable-shaped opening 421).

For the charged beam (electron beam) exposure system with low acceleration voltage for directly forming a pattern onto a wafer, a technique to reduce the influence of the space charge effect induced between the first shaping aperture and the second shaping aperture, is already invented and disclosed. Specifically, in the beam exposure apparatus, plural rectangular openings with either different shape or area size are added to the first aperture, and deflection scheme is arranged so that the smallest area opening on the first aperture can be selected to enable irradiation on the desired region on the second shaping aperture. (refer to, e.g., Japanese Patent Application Laid-open (JP-A) No. 2006-128564).

As can be seen from FIG. 14 the resolution deteriorates more along the side formed by the first shaping aperture, which is further away from the target plate, than the other side formed by the second shaping aperture, closer to the target.

FIG. 15 shows an example of profile, dimension, and center of a beam formed by the first and second shaping apertures. It can also be seen from FIG. 15 that dimensional differences are induced among pattern 94 developed under proper condition in terms of time (threshold +/−0), pattern 92 developed in shorter developing time than the proper setting (threshold −), and pattern 96 developed in longer developing time than the proper setting (threshold +). Thus, variations of development time cause deterioration of pattern dimension accuracy. Furthermore, center positions 93, 95 and 97 of the patterns 92, 94, and 96 respectively do not match due to deteriorated and variable resolution mentioned above.

While the example mentioned above refers to a case of forming a pattern with one shot, there are, in reality, many cases where one pattern is formed by combining multiple shots. FIG. 16 shows an example of a pattern formed by combining multiple patterns. In this case, one pattern 31 is formed by stitching combining pattern 33 and pattern 35. FIG. 17 shows the two shots and their respective profiles for forming the pattern shown in FIG. 16. Combining formed beams 85 and 87 results in a new beam with the synthesized beam profile 89. Even in this case, the same problems as shown in FIG. 14 are induced. In addition, there are such error factors as; positioning error of datum position 86 of shot 85, positioning error of datum position 88 of shot 87, and a error in shot dimension $L_3$ of shot 85 with a side resolution of which is deteriorated. It is not easy to cope with such three error factors.

BRIEF SUMMARY OF THE INVENTION

The object of the present invention is to provide methods for eliminating detrimental effects caused by beam resolution degradation due to the space charge effect on the beam formed by the first and second shaping apertures in a mask writing system.

In accordance with one aspect of the present invention, a writing method includes emitting a first charged particle beam formed to be a first shape by passing through a first shaping aperture and a second shaping aperture, onto a target workpiece; and emitting a second charged particle beam formed to be a second shape by passing through the first shaping aperture and the second shaping aperture, wherein the second charged particle beam is superimposed onto a same position exposed by the first charged particle beam and is formed by using an opposite sides of respective first and second shaping apertures to those used for the first shape.

In accordance with another aspect of the present invention, a writing method includes emitting a first charged particle beam formed to be a first shape by passing through both a first shaping aperture and a second shaping aperture, onto a target workpiece; and emitting a second charged particle beam formed to be a second shape by passing through both the first shaping aperture and the second shaping aperture, in such a way the second shape is positioned adjacent to the first shape, but with corresponding sides which are sides of respective shapes formed by one same aperture of the first shaping aperture and the second shaping aperture, face each other.

DETAILED DESCRIPTION OF THE INVENTION

In the following Embodiments, a structure utilizing an electron beam, as an example of a charged particle beam, will be described. Charged particle beam is not limited to the electron beam, and may be another charged particle beam, such as ion beam.

Embodiment 1

Figure 1:
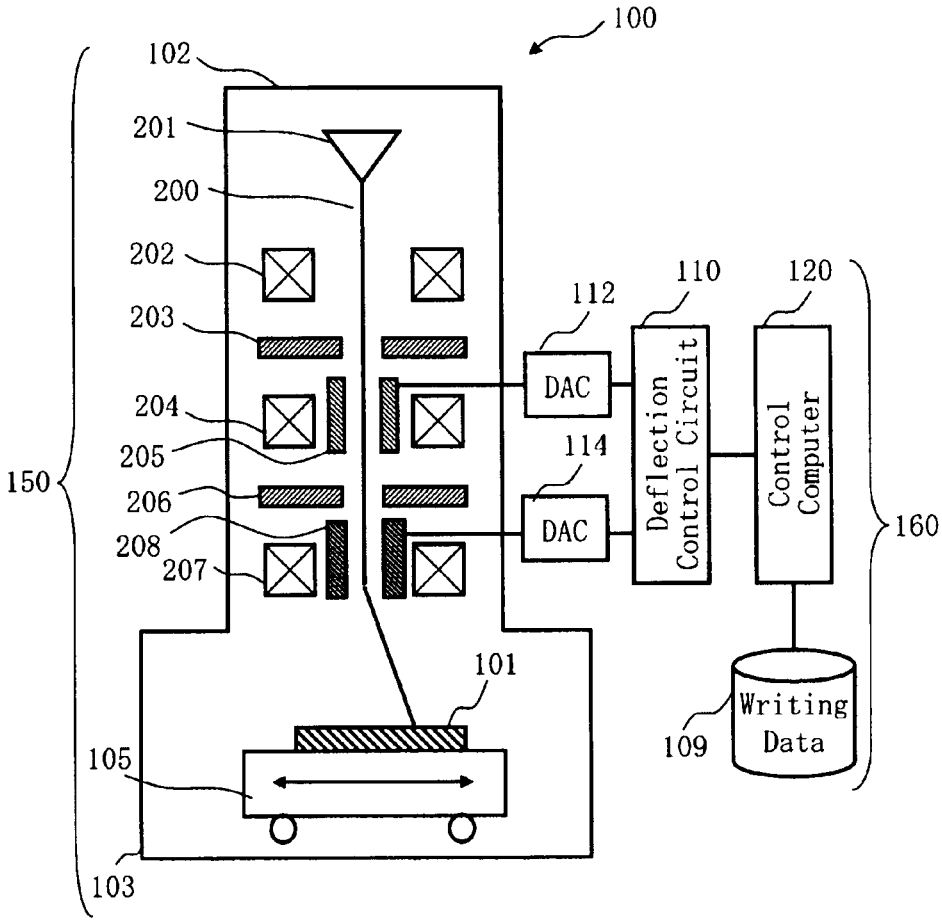
FIG. 1 is a schematic diagram illustrating a structure of a writing apparatus according to Embodiment 1.

FIG. 1 shows a schematic diagram illustrating a structure of a writing apparatus described in Embodiment 1. In FIG. 1, a pattern writing apparatus 100 includes a writing unit 150 and a control unit 160. The pattern writing apparatus 100 serves as an example of a charged particle beam writing apparatus. The pattern writing apparatus 100 writes a desired pattern on a target workpiece 101. The control unit 160 includes a control computer 120, a deflection control circuit 110, a magnetic disk drive 109, and digital-to-analog converters (DAC) 112 and 114. The writing unit 150 includes an electron lens barrel 102 and a writing chamber 103. In the electron lens barrel 102, there are an electron gun assembly 201, an illumination lens 202, a first shaping aperture 203, a projection lens 204, a shaping deflector 205, a second shaping aperture 206, an objective lens 207, and a deflector 208 adequately arranged. In the writing chamber 103, there is an movable XY stage 105 adequately arranged. On the XY stage 105, target work piece 101 is placed being supported by three pins. Typical target work piece 101, for example, is a mask for exposing or "transferring and printing" a pattern onto a wafer. Such a mask may be a mask blank where no patterns are formed, for example. Data for writing pattern are stored in the magnetic disk device 109. The control computer 120 controls the writing unit 150 and the deflection control circuit 110. The shaping deflector 205 and the deflector 208 are controlled through the deflection control circuit 110. While only the structure elements necessary for explaining Embodiment 1 are shown in FIG. 1, it should be noted that there are other necessary elements for the pattern writing apparatus 100, but no reference is made.

An electron beam 200 emitted from the electron gun assembly 201, irradiates the entire first aperture 203 having an opening or "hole" in the shape of a rectangle using the illumination lens 202. At this point, the electron beam 200 is shaped to be a rectangle. Such a rectangular shape may be a square, rhombus, rhomboid, etc. Then, after having passed through the opening of the first shaping aperture 203, the electron beam 200 is projected onto the second shaping aperture 206 by the projection lens 204 forming a first aperture image. The position of the first aperture image on the second shaping aperture 206 is deflection-controlled by the shaping deflector 205, and the shape and size of the beam can be changed. Thereby, the electron beam 200 is formed. After having passed through the opening of the second aperture 206, the electron beam 200 of a second aperture image is focused by the objective lens 207 and deflected by the deflector 208 which is controlled by the deflection control circuit 110, to reach a desired position on the target workpiece 101 placed on the XY stage 105 which moves continuously.

Figure 2:
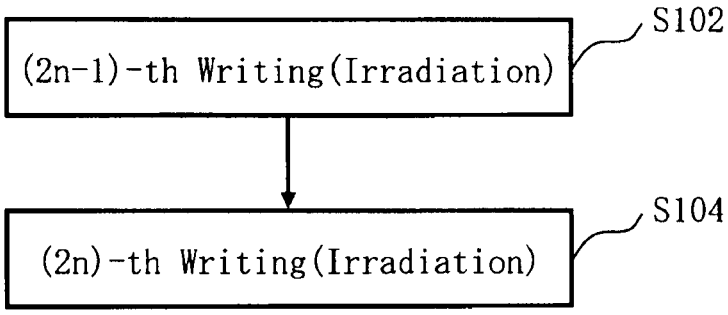
FIG. 2 is a flowchart showing main steps of a writing method of Embodiment 1.
Figure 3:
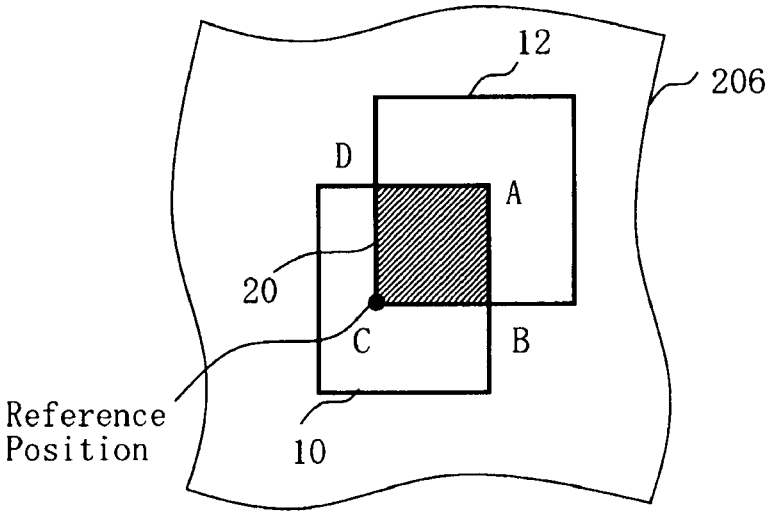
FIG. 3 shows an example of a shaped beam image of (2n−1)th writing with Embodiment 1.
Figure 4:
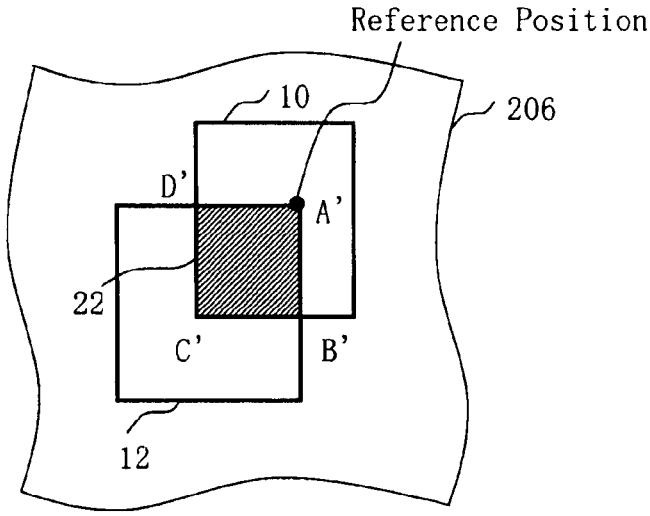
FIG. 4 shows an example of a shaped beam image of (2n) th writing with Embodiment 1.

FIG. 2 is a flowchart showing main steps of a writing method described in Embodiment 1. In Embodiment 1, in order to eliminate the detrimental effects caused by beam resolution degradation due to space charge effect in the beam formed by the first and second shaping apertures, multiple writing is performed as follows: As shown in FIG. 2, in the odd-number (2n−1)-th writing (exposure) step (S102), and the even-number (2n)-th writing (exposure) step (S104), beam is formed as follows:

FIG. 3 shows an example of the shaped beam image in the (2n−1)-th writing described in Embodiment 1. FIG. 4 shows an example of the shaped beam image in the 2n-th writing described in Embodiment 1. FIGS. 3 and 4 show the states in which a first aperture image 10 having passed through the first shaping aperture 203 is irradiated onto the second shaping aperture 206. FIG. 3 shows the (2n−1)-th writing, and FIG. 4 shows the 2n-th writing. First, "shot reference position" will be explained referring to FIG. 3. The beam portion (denoted square ABCD in the figure) which passes through a second shaping aperture opening 12 in the first shaping aperture image 10 becomes the resultant shaped beam. The first shaping aperture image 10 is an image of the opening of the first shaping aperture formed on the second shaping aperture. C point in FIG. 3 is an intersection of the two sides of the second shaping aperture opening 12, and the shot point corresponding to this intersection will be called a "shot reference point." As shown in FIG. 3, the shot reference position has a feature that it does not change even when the first aperture image is moved on the second aperture, and the size of the shaped beam is changed. This shot forms an image on the target workpiece, and the position of this shot is controlled by adjusting the reference position of the shot on the target workpiece controlling the deflector 208. In the example of FIG. 3, the first shaping aperture image 10 is formed at the lower left of the second shaping aperture opening 12. However, even in the case the first shaping aperture image 10 is formed at the upper right of the second shaping aperture opening 12 as shown in FIG. 4, the "shot reference point" can be defined the same. Namely, the point of the shot corresponding to an intersection A' of the two sides of the second shaping aperture opening 12 can be defined as the "shot reference point." Also in this case, the reference position of the shot does not change even when the first aperture image is moved on the second aperture, and the size of the shaped beam is changed. The position of this shot is controlled by adjusting the reference position of the shot on the target workpiece controlling the deflector 208. Hereafter, the writing method of Embodiment 1 will be explained with reference to the flowchart of FIG. 2.

First, when performing the (2n−1)-th writing, the first electron beam 200 (first charged particle beam) is formed at the lower left side of the opening 12 of the second shaping aperture 206. FIG. 3 shows the case where a shaped beam image 20 is formed as square ABCD (first shape). In this first shaped electron beam 200, the side AB and the side DA are formed by the first shaping aperture 203. On the other hand, the side BC and the side CD are formed by the second shaping aperture 206.

As mentioned above, in the (2n−1)-th writing (exposure) step at S102, the target workpiece 101 is exposed by the first electron beam 200 having been shaped as a square by passing through the first and second shaping apertures 203 and 206 as shown in FIG. 3.

Next, when performing the 2n-th writing, the second electron beam 200 (second charged particle beam) is formed at the upper right side of the opening 12 of the second shaping aperture 206. FIG. 4 shows the case where a shaped beam image 22 is formed as square A'B'C'D' (second shape). In this second shaped electron beam 200, the side A'B' and the side D'A' are formed by the second shaping aperture 206. On the other hand, the side B'C' and the side C'D' are formed by the first shaping aperture 203. The shaped beam images 20 and 22 are controlled by the shaping deflector 205 so that they may become the same shape of the same size. Thus, the two squares shaped as mentioned above have sides overlapped by those formed by apertures one and two respectively. In other word, as to the two squares shaped as mentioned above, each side of the squares is formed in the state where the shaping apertures which form the each side are opposite.

As mentioned above, in the 2n-th writing (exposure) step at S104, the second electron beam 200 formed to be a square by passing through the first and second shaping apertures 203 and 206, is superimposed onto the same position exposed by the first charged particle beam, but using the opposite sides of respective first and second shaping apertures to those used for the first electron beam 200 in S102. In other word, each side of the square shaped beam image 22 corresponding to each side of the shaped beam image 20 is formed by either the first shaping aperture 203 or the second shaping aperture 206 being opposite to the first shaping aperture 203 or the second shaping aperture 206 which forms the each side of the shaped beam image 20, and the second electron beam 200 overlappingly irradiates the position which has been irradiated by the first electron beam 200.

Figure 5:
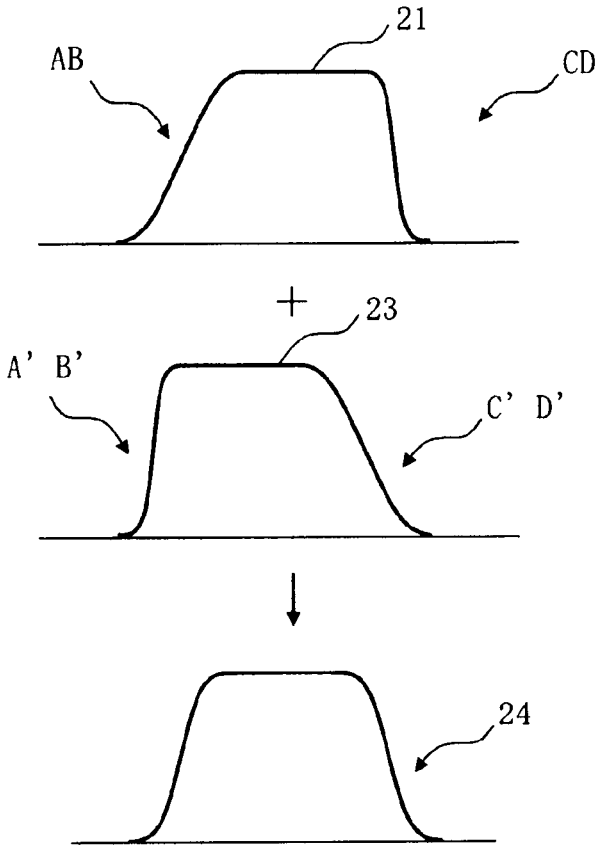
FIG. 5 shows examples of two beam profiles and an example of a beam profile synthesized by combining them in Embodiment 1.
Figure 15:
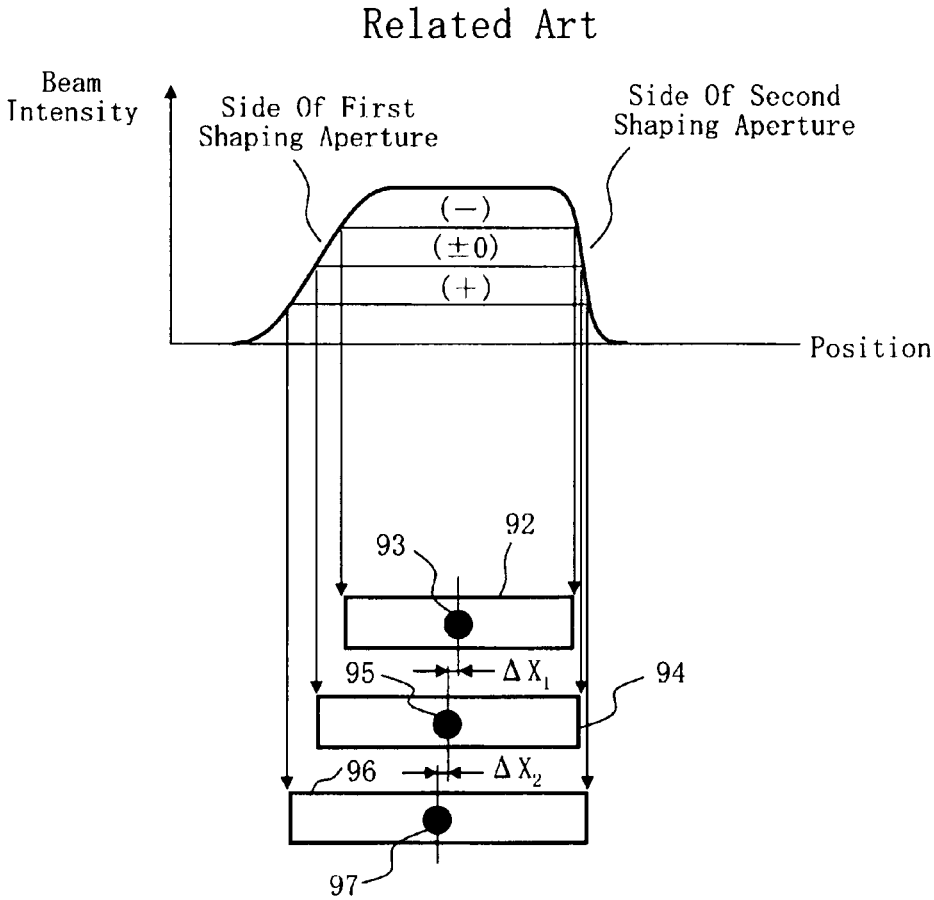
FIG. 15 shows an example of variation of beam profiles, pattern dimensions, and pattern center positions of respective beam profiles formed variably dependent on development parameter differences even though they are all formed by the first and second shaping apertures.
Figure 16:
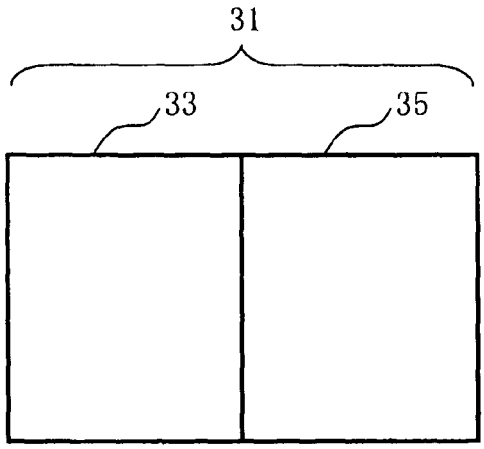
FIG. 16 Related Art
FIG. 16 shows an example of a pattern formed by combining multiple patterns.
Figure 17:
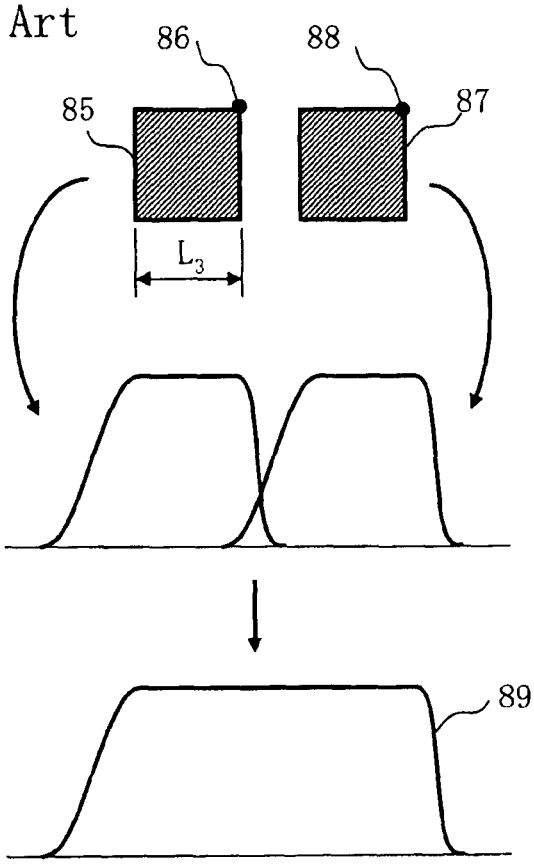
FIG. 17 shows an example of two shots for forming the pattern shown in FIG. 16, and an example of their respective profiles.

FIG. 5 shows examples of two beam profiles and an example of a beam profile made by combining them in Embodiment 1. As to a beam profile 21 to be emitted onto the target workpiece 101 in the (2n−1)-th writing, since the left side AB is formed by the first shaping aperture 203, its resolution is degraded (the rise of the beam intensity is dull). On the other hand, since the right side CD is formed by the second shaping aperture 206, its resolution is good (the fall of the beam intensity is sharp). Meanwhile, as to a beam profile 23 to be emitted onto the target workpiece 101 in the 2n-th writing, since the left side A'B' is formed by the second shaping aperture 206, its resolution is good (the rise of the beam intensity is sharp). On the other hand, since the right side C'D' is formed by the first shaping aperture 203, its resolution is degraded (the fall of the beam intensity is dull). It is feasible to make the right and left sides symmetrical like a beam profile 24 by combining the two beam profiles 21 and 23. Thus, by combining multiple shots in such a way that both first and second shaping apertures are used for the same sides of shape 1 and 2, making the profile of the beam after the multiple writing symmetrical. Consequently, it is achievable to suppress the displacement of the pattern center position, caused by the position of the threshold value, which is the problem described with reference to FIG. 15. Therefore, pattern dimension can be adjusted by controlling the threshold value. Moreover, it is feasible to improve the resolution of the side where the resolution is degraded because of having been formed by the first shaping aperture 203. As a result, the precision of pattern dimension can be improved.

Figure 6:
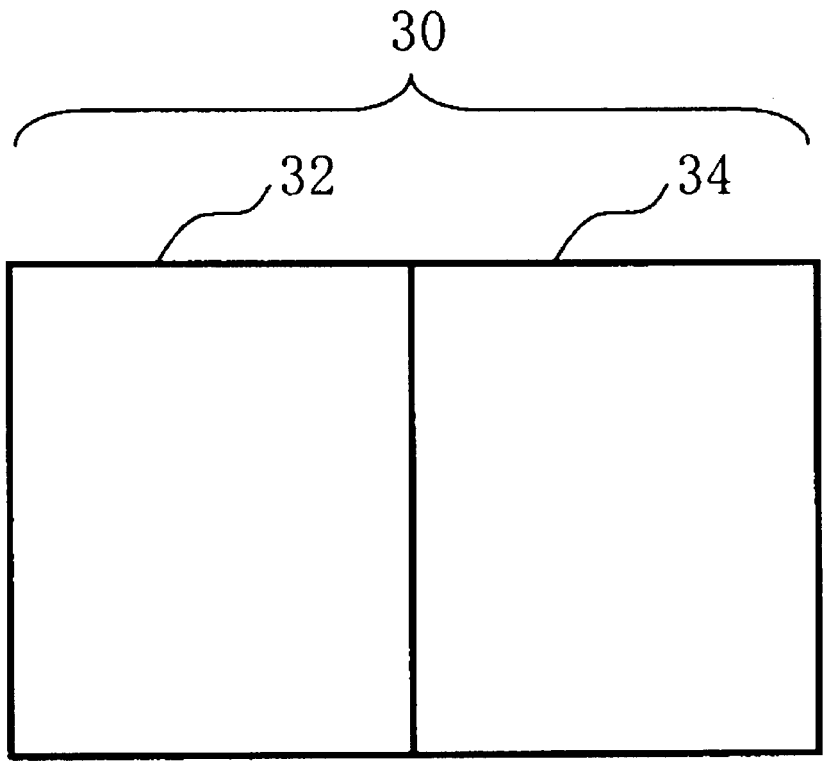
FIG. 6 shows an example of a pattern formed by combining two patterns with Embodiment 1.

The pattern to be written is not limited to the case of being formed by one forming beam (shot), and it may be formed by combining multiple shots in many cases. FIG. 6 shows an example of a pattern which is formed by combining two patterns described in Embodiment 1. FIG. 6 shows the case where a square pattern 30 is formed by combining two square patterns 32 and 34. In this case, the exposure is performed by two shots, one for forming the pattern 32 and the other for forming the pattern 34.

Figure 7:
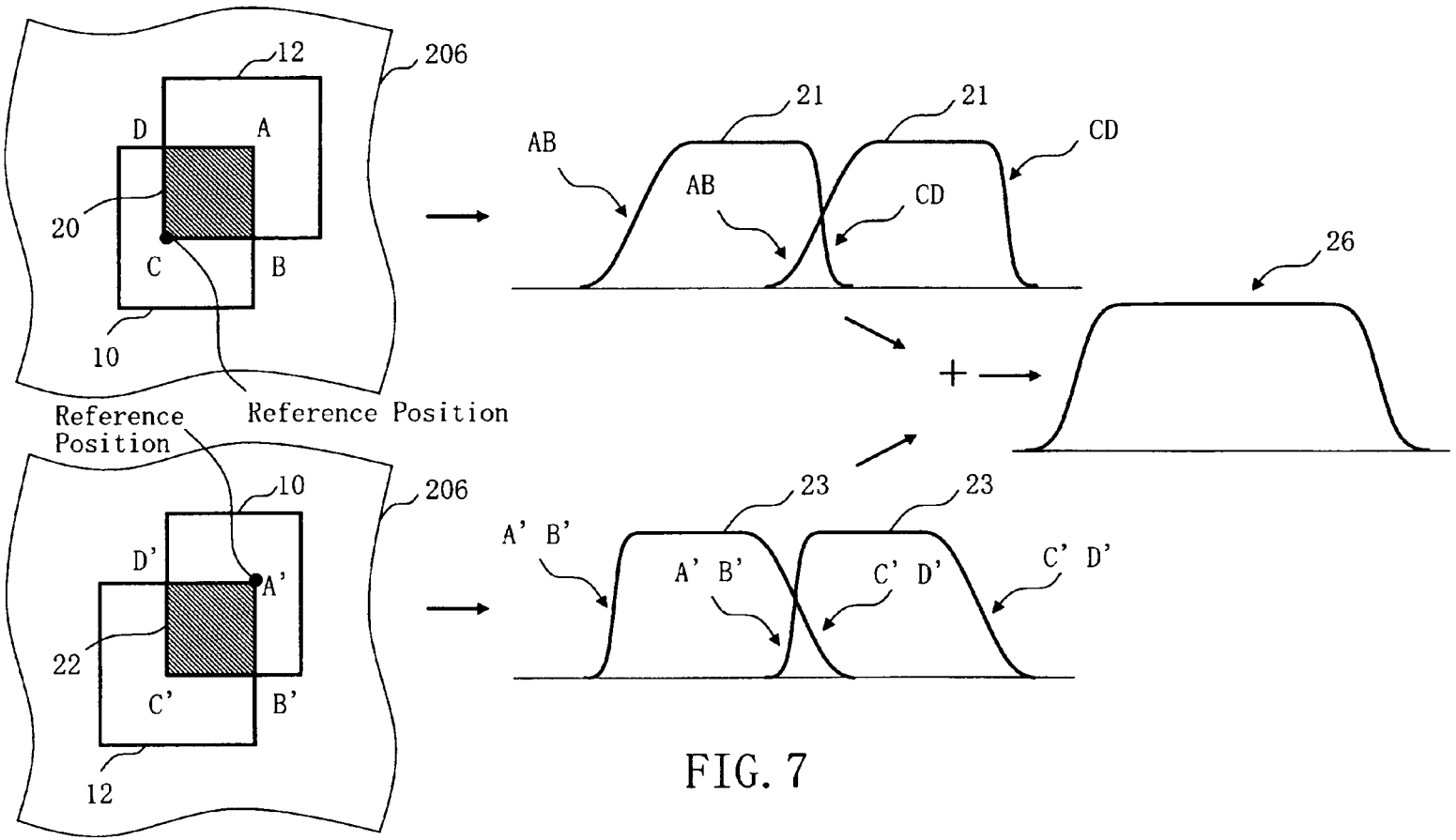
FIG. 7 shows an example of shaped beam image in each of odd-number-th and the even-number-th writing, each beam profile of each of the two shots to be combined, and a resultant beam profile after combining the beams, with Embodiment 1.

FIG. 7 shows an example of shaped beam image in each of the odd-number-th and the even-number-th writing, an example of each beam profile made by combining the two shots, and an example of a beam profile made by combining both beams, described in Embodiment 1. First, when performing the (2n−1)-th writing, the first electron beam 200 (first charged particle beam) is formed at the lower left side of the opening 12 of the second shaping aperture 206. The shaped beam image 20 is formed as square ABCD (first shape) like the case of FIG. 3. In this first shaped electron beam 200, the side AB and the side DA are formed by the first shaping aperture 203. On the other hand, the side BC and the side CD are formed by the second shaping aperture 206.

As mentioned above, in the (2n−1)-th writing (exposure) step at S102, two first electron beams 200, each of which has been formed as square ABCD by passing through the first and second shaping apertures 203 and 206, expose the target work piece 101 so that they may be placed in line next to each other. As to the beam profile 21 to be emitted onto the target workpiece 101 in the (2n−1)-th writing, resolution of the left side AB having been formed by the first shaping aperture 203 is degraded (the rise of the beam intensity is dull). On the other hand, resolution of the right side CD having been formed by the second shaping aperture 206 is good (the decay of the beam intensity is sharp). Thus, such beam profiles 21 are adjacently located.

Next, when performing the 2n-th writing, the second electron beam 200 (second charged particle beam) is formed at the upper right side of the opening 12 of the second shaping aperture 206. The shaped beam image 22 is formed as square A'B'C'D' (second shape) like the case of FIG. 4. In this second shaped electron beam 200, the side A'B' and the side D'A' are formed by the second shaping aperture 206. On the other hand, the side B'C' and the side C'D' are formed by the first shaping aperture 203. The shaped beam images 20 and 22 are controlled by the shaping deflector 205 so that they may become the same shape of the same size. Thus, the two squares shaped as mentioned above have sides overlapped by those formed by apertures one and two respectively. In other word, as to the two squares shaped as mentioned above, each side of the squares is formed in the state where the shaping apertures which form the each side are opposite.

As mentioned above, in the 2n-th writing (exposure) step at S104, the adjacent two second electron beams 200, each of which has been formed to be square by passing through the first and second shaping apertures 203 and 206, is superimposed onto the same position exposed by the first charged particle beam, but using the opposite sides of respective first and second shaping apertures to those used for the first electron beam 200 in s102. In other word, the adjacent two second electron beams 200 is formed in the state where the shaping aperture which forms each side of the square shaped beam image 22 is opposite to the other shaping aperture which forms each side of the shaped beam image 20, overlappingly irradiate the position which has been irradiated by the two first electron beams 200. As to the beam profile 23 to be emitted onto the target workpiece 101 in the 2n writing, resolution of the left side A'B'having been formed by the second shaping aperture 206 is good (the rise of the beam intensity is sharp). Thus, the pattern resolution can be improved by that the perimeter side of the pattern formed by combining the first and second shapes is formed by the second shaping aperture. On the other hand, resolution of the right side C'D' having been formed by the first shaping aperture 203 is degraded (the fall of the beam intensity is dull). Thus, such beam profiles 23 are adjacently located.

By combining the adjacent two beam profiles 21 and the adjacent beam profile 23, it is feasible to balance the right and left sides like a beam profile 26. Consequently, even when combining two patterns, it is also achievable to suppress the displacement of the pattern center position, caused by the position of the threshold value, which is the detrimental issue described in FIG. 15. Therefore, pattern dimension can be adjusted by controlling the threshold value. Moreover, it is feasible to improve the resolution of the side where the resolution is degraded having been formed by the first shaping aperture 203. As a result, the precision of pattern dimension can be enhanced.

Figure 8:
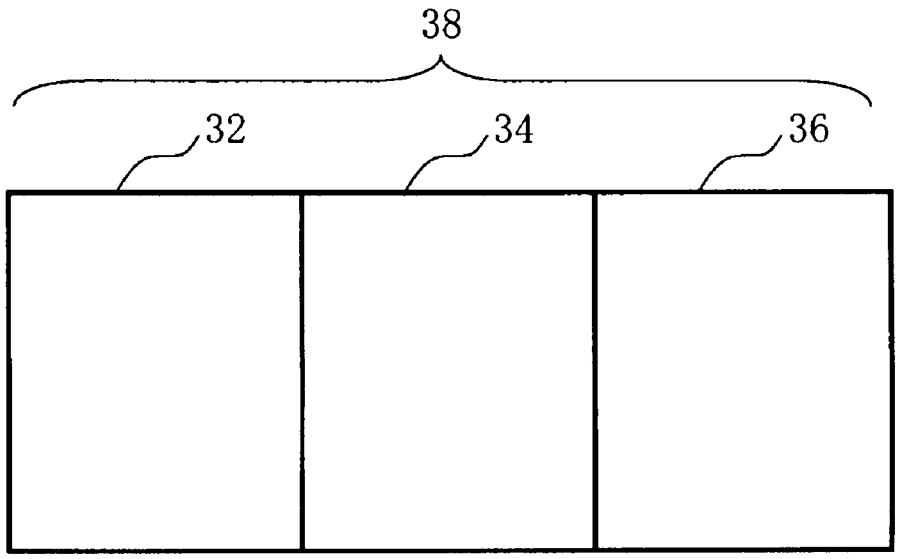
FIG. 8 shows an example of a pattern formed by stitching three patterns with Embodiment 1.

Although FIG. 6 shows the case of combining two patterns, it is not limited thereto. FIG. 8 shows an example of a pattern formed by combining three patterns described in Embodiment 1. As shown in FIG. 8, even when forming a square pattern 38 by combining three square patterns 32, 34, and 36, the same result can be acquired by the state where a shaping aperture which forms each side in the odd-number-th writing is opposite to the other shaping aperture which forms each side in the even-number-th writing in the multiplex writing. Furthermore, the same result can be acquired by a pattern formed by combining four or more patterns.

By performing multiplex writing as mentioned above, it is feasible to eliminate the detrimental effects caused by the beam resolution degradation due to space charge effect in the beam formed by the first and second shaping apertures.

Embodiment 2

In Embodiment 1, the case of eliminating detrimental effects caused by beam resolution degradation by performing multiplex writing has been explained. However, even if the multiplex writing is not performed, there is a case of eliminating the detrimental effects by another way of writing. In Embodiment 2, a writing method which suppresses beam resolution degradation, without performing multiple writing will be described. The apparatus structure in Embodiment 2 is the same as that of FIG. 1.

It is described in Embodiment 2 how to form one pattern with two or more shots.

Figures 9A, 9B, 9C, 9D, 9E:
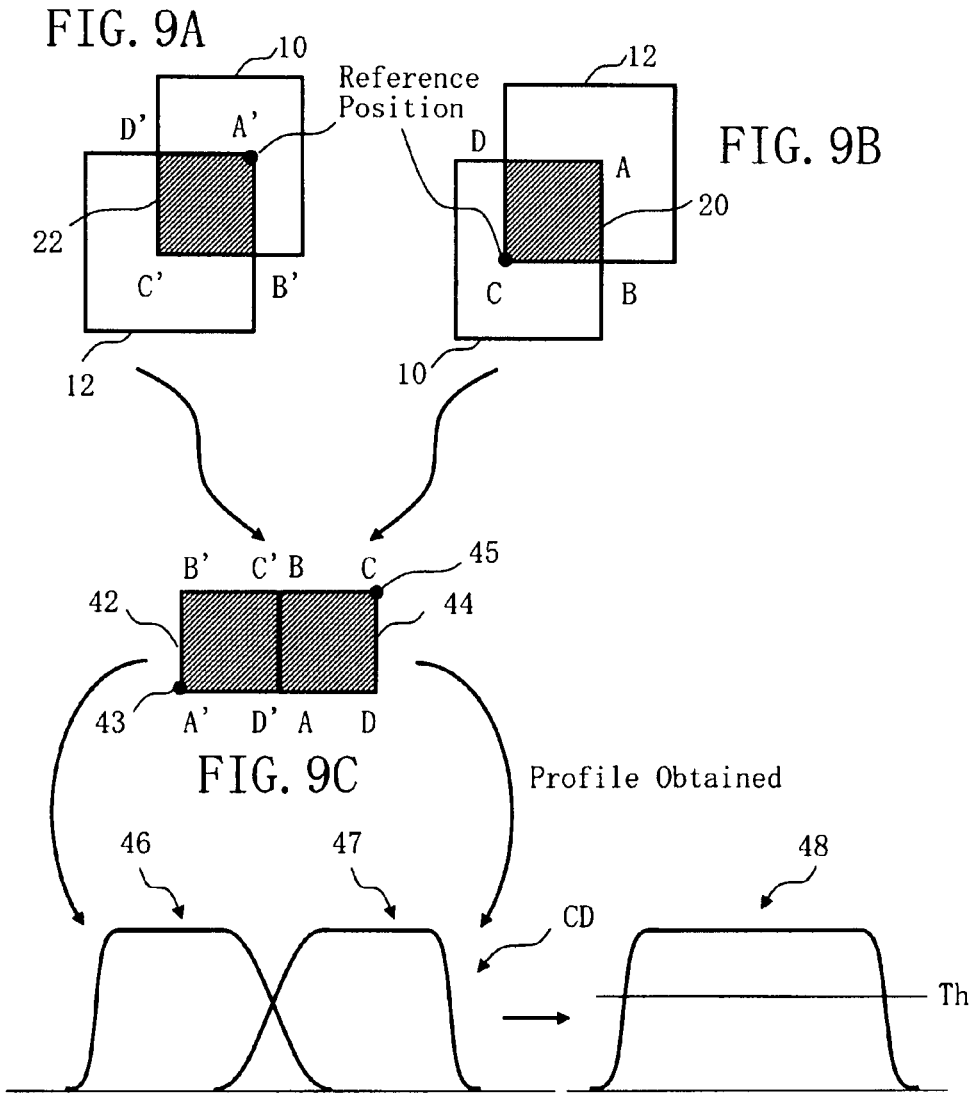
FIGS. 9A to 9E show examples of forming a beam for writing one pattern with two shots, beam profiles of two shots to be combined, and a beam profile after synthesized.

FIGS. 9A to 9E show examples of forming a beam for writing one pattern with two shots, beam profiles of two shots to be combined, and a beam profile after combining. In the present Embodiment, as explained below, the electron beam 200 (first charged particle beam) is formed so that the side located opposite to the combining direction may become the side formed by the second shaping aperture 206. First, beam forming of a shot 42 at the left-hand side of the pattern shown in FIG. 9C will be explained. As shown in FIG. 9A, the first aperture image 10 is formed at the upper right of the second shaping aperture opening 12, to form the electron beam 200 (first charged particle beam). The shaped beam image 22 is formed as square A'B'C'D' (first shape) as well as the case of FIG. 4. In this shaped first electron beam 200, the side A'B' and the side D'A' were formed by the second shaping aperture 206. On the other hand, the side B'C' and the side C'D' were formed by the first shaping aperture 203.

As mentioned above, as the first writing (exposure) step, the target workpiece 101 is exposed by the first electron beam 200 formed as square A'B'C'D' by passing through both the first shaping aperture 203 and the second shaping aperture 206. Up and down and right and left of the shaped beam image 22, which has passed through the second shaping aperture 206, are reversed by passing through the objective lens 207. Therefore, in a shaped beam image 42 on the target workpiece 101, the side A'B' constitutes the side located opposite to the combining direction, namely constitutes one side of the pattern after combining. Thus, in a beam profile 46, the left side A'B' having been formed by the second shaping aperture 206 has good resolution (the rise of the beam intensity is sharp).

On the other hand, the right side C'D' having been formed by the first shaping aperture 203 has degraded resolution (the fall of the beam intensity is dull).

Next, beam forming of a shot 44 at the right-hand side of the pattern shown in FIG. 9C will be explained. As shown in FIG. 9B, the first aperture image 10 is formed at the lower left of the second shaping aperture opening 12, to form the electron beam 200 (second charged particle beam). The shaped beam image 22 is formed as square ABCD (second shape) as well as the case of FIG. 3. In this shaped first electron beam 200, the side BC and the side CD are formed by the second shaping aperture 206. On the other hand, the side AB and the side DA are formed by the first shaping aperture 203.

As mentioned above, in the second writing (exposure) step, the second electron beam 200 formed to be square ABCD by passing through both the first and second shaping apertures 203 and 206, in such a way the second shape is positioned adjacent to the first shape, but with corresponding sides which are sides of respective shapes formed by a same aperture of the first shaping aperture or and the second shaping aperture, face each other, is emitted. In other word, the second electron beam 200 is formed in the state where the shaping aperture which forms each side of the square shaped beam image 20 is opposite to the other shaping aperture which forms each side of the shaped beam image 22, irradiates the position adjacent to the position which was irradiated by the first electron beam so that sides formed by the first shaping aperture 203 may face each other. Up and down and right and left of the shaped beam image 20, which has passed through the second shaping aperture 206, are reversed by passing through the objective lens 207. Therefore, in a shaped beam image 44 on the target workpiece 101, the side CD constitutes the side located opposite to the combining direction, namely constitutes the other side of the pattern after combining. Thus, in a beam profile 47, since the right side CD was formed by the second shaping aperture 206, it has good resolution (the rise of the beam intensity is sharp). On the other hand, since the left side AB was formed by the first shaping aperture 203, it has degraded resolution (the fall of the beam intensity is dull).

By combining the adjoining beam profile 46 and beam profile 47 shown in FIG. 9D, the right and left sides can be the sides formed by the second shaping aperture 206 like a beam profile 48 as shown in FIG. 9E. Consequently, even when combining two patterns, it is achievable not only to suppress the displacement of the pattern center position, caused by the disposition of the threshold value, which is a detrimental issue described with reference to FIG. 15, but also to improve the resolution of the left and right sides. As a result, the precision of pattern dimension can be enhanced further than Embodiment 1.

Embodiment 2 is described as follows: a reference position 43 of the shaped beam image 42 on the target workpiece 101 is a vertex (A') on the side located opposite to the combining direction. A reference position 45 of the shaped beam image 44 on the target workpiece 101 is a vertex (C) on the side located opposite to the combining direction. By virtue of having such reference positions, one of the error factors can be reduced. That is, since the side with degraded resolution is the inner side, the shot dimension error resulting from the side with degraded resolution can be eliminated from the error factors. Consequently, it is achievable to reduce the three error factors mentioned above to two error factors: the position error of the reference position 43, and the position error of the reference position 45. Therefore, errors can be reduced.

Figure 10:
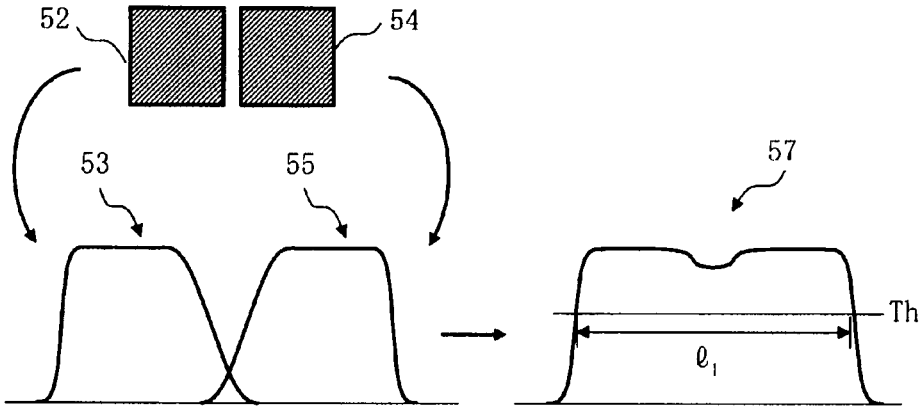
FIG. 10 shows an example of multiple shot positions for synthesizing one pattern.

As to a shot position when combining shots for forming a pattern in each Embodiment mentioned above, the following cases exist: FIG. 10 shows an example of a shot position for a pattern which is formed by combining. FIG. 10 shows the case where a shaped beam image 52 on the target workpiece 101 by the first electron beam 200 and a shaped beam image 54 on the target workpiece 101 by the second electron beam 200 are irradiated with a certain space between them. Combining a beam profile 53 of the shaped beam image 52 and a beam profile 55 of the shaped beam image 54, wherein both the shaped beam images are adjacent each other, a beam profile 57 can be obtained. Since there is a space, a recessed portion is produced at the upper part. However, as long as the bottom of the recessed portion does not reach the threshold value Th, there is no effect on the pattern shape. Then, a pattern of dimension $l_1$ can be obtained.

Figure 11:
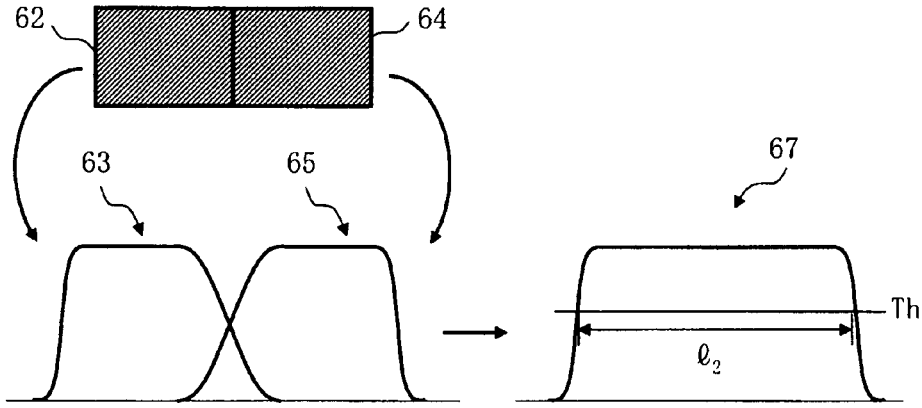
FIG. 11 shows another example of multiple shot positions for synthesizing one pattern.

FIG. 11 shows another example of a shot position for a pattern formed by combining. FIG. 11 shows the case where a shaped beam image 62 on the target workpiece 101 by the first electron beam 200 and a shaped beam image 64 on the target workpiece 101 by the second electron beam 200 are irradiated to be just contacting each other. Combining a beam profile 63 of the shaped beam image 62 and a beam profile 65 of the shaped beam image 64, wherein both the shaped beam images are adjacent each other, a beam profile 67 can be obtained. If the profiles cross at the intermediate position of the beam intensity, the upper part becomes flat. Since the upper part is parallel, naturally, it does not affect the threshold value Th, thereby there is no effect on the pattern shape. Then, a pattern of dimension $\mathbf{1}_2$ can be obtained.

Figure 12:
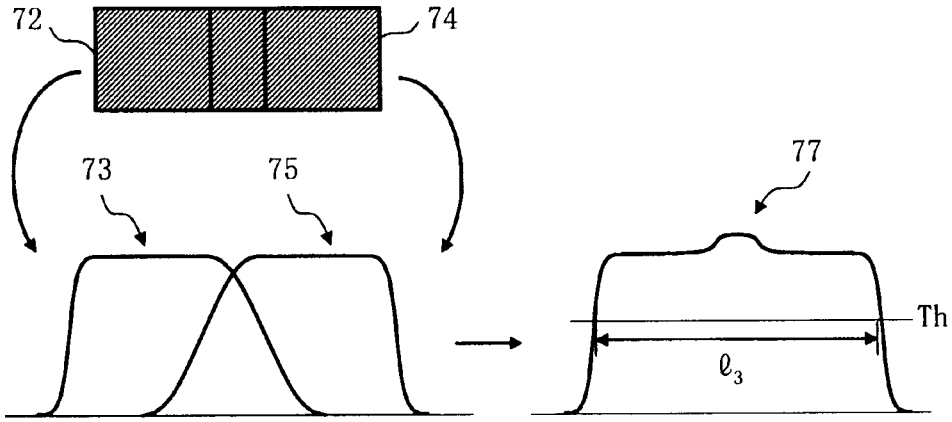
FIG. 12 is another example of the same implementation as in FIGS. 10 and 11.
Figure 13:
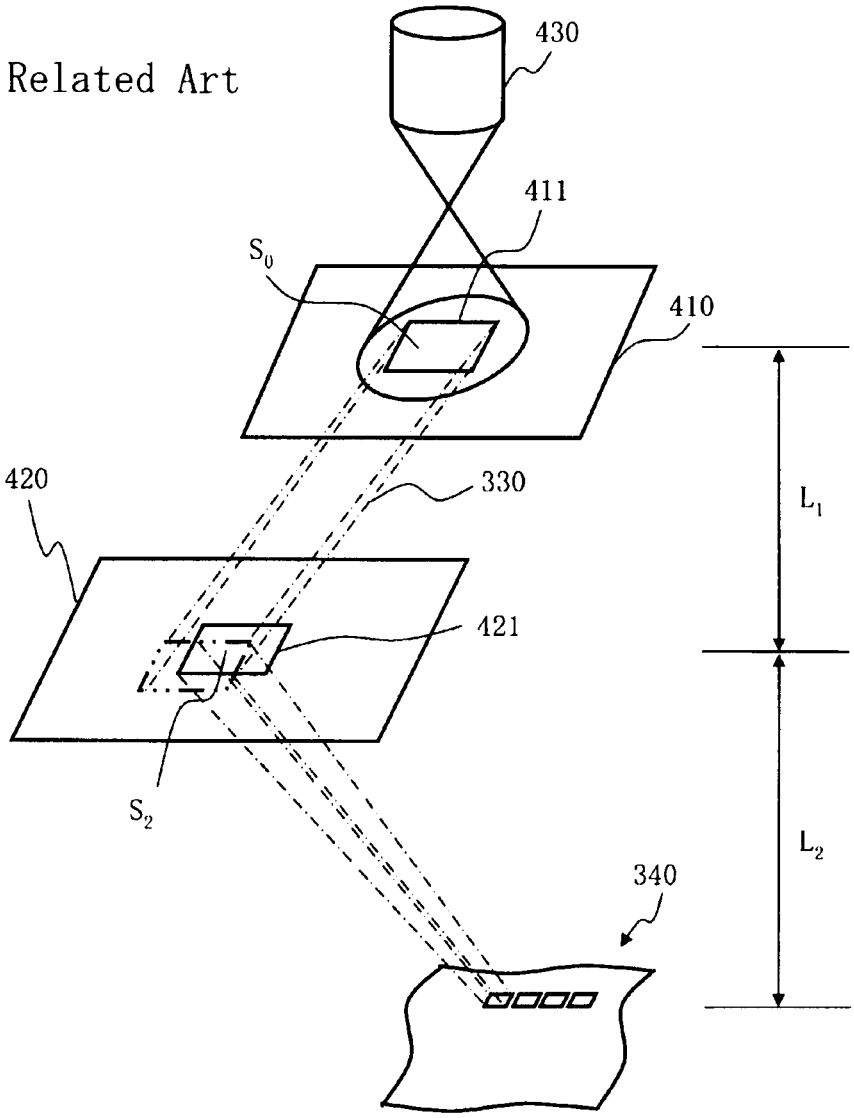
FIG. 13 is a schematic diagram for illustrating operations of a variable-shaped type electron beam (EB) writing apparatus.
Figure 14:
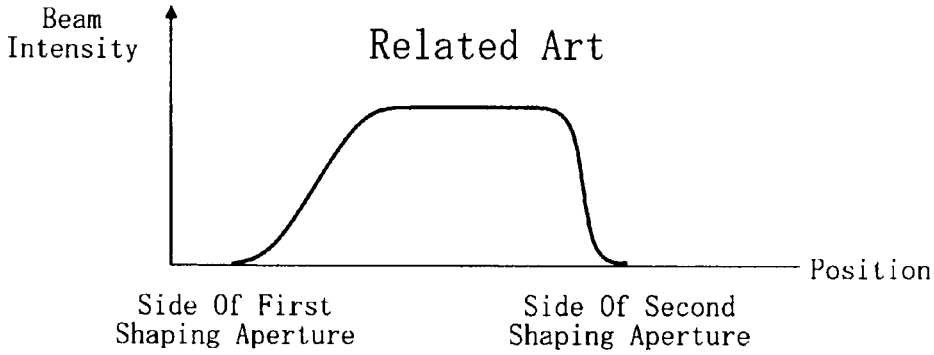
FIG. 14 shows an example of a profile of a beam formed by the first and second shaping apertures.

FIG. 12 shows another example of a shot position for a pattern formed by combining. FIG. 12 shows the case where a shaped beam image 72 on the target workpiece 101 by the first electron beam 200 and a shaped beam image 74 on the target workpiece 101 by the second electron beam 200 are irradiated to be partly overlapping each other. Combining a beam profile 73 of the shaped beam image 72 and a beam profile 75 of the shaped beam image 74, wherein both the shaped beam images are adjacent each other, a beam profile 77 can be obtained.. Since they are partly overlapping, a protruding portion is produced at the upper part. However, the protrusion does not affect the threshold value Th, and there is no effect on the pattern shape. Then, a pattern of dimension 13 can be obtained.

As mentioned above, it is preferable to emit the first and second charged particle beams so that they may partly overlap each other. Alternatively, it is also preferable to emit the first and second charged particle beams so that they may have a space there between. Alternatively, it is also preferable to emit the first and second charged particle beams so that their shaped beam images may just contact each other.

While the embodiments have been described above with reference to specific examples, the present invention is not limited to these specific ones.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other charged particle beam writing method and apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing method comprising:

emitting a *plurality of* first charged particle [beam] *beams* formed to be a first shape by passing through a first shaping aperture and a second shaping aperture, onto a target workpiece *so that the plurality of first charged particle beams are placed in line next onto the target workpiece*; and emitting, *after emitting the plurality of first charged particle beams,* a *plurality of* second charged particle [beam] *beams* formed to be a second shape by passing through the first shaping aperture and the second shaping aperture, wherein the second charged particle beam is superimposed *so that the plurality of second charged particle beams are placed in line next* onto a same position exposed by the *plurality of* first charged particle [beam] *beams* and is formed by using an opposite sides of respective first and second shaping apertures to those used for the first shape.

2. The method according to claim 1, wherein the first shape and the second shape are squares.

3. The method according to claim 1, wherein each of the first shape and the second shape includes a first side formed by the first shaping aperture and a second side formed by the second shaping aperture.

4. The method according to claim 3, wherein the first charged particle beam and the second charged particle beam are emitted so that the first side included in the first shape overlaps with the second side included in the second shape.

5. The method according to claim 1, wherein a beam profile of the first shape and a beam profile of the second shape are combined to be symmetrical.

[6. A writing method comprising:

emitting a first charged particle beam formed to be a first shape by passing through both a first shaping aperture and a second shaping aperture, onto a target workpiece; and emitting a second charged particle beam formed to be a second shape by passing through both the first shaping aperture and the second shaping aperture, in such a way the second shape is positioned adjacent to the first shape, but with corresponding sides which are sides of respective shapes formed by one same aperture of the first shaping aperture and the second shaping aperture, face each other.]

[7. The method according to claim 6, wherein the first charged particle beam and the second charged particle beam are emitted so that they partly overlap each other.]

[8. The method according to claim 6, wherein the first charged particle beam and the second charged particle beam are emitted so that they have a space therebetween.]

[9. The method according to claim 6, wherein the second charged particle beam is emitted onto a position adjacent to another position irradiated by the first charged particle beam, in order that a side of the first shape and a side of the second shape formed by the second shaping aperture become outer sides.]

* * * * *